United States Patent
Koyama

(10) Patent No.: US 8,817,516 B2
(45) Date of Patent: Aug. 26, 2014

(54) MEMORY CIRCUIT AND SEMICONDUCTOR DEVICE

(71) Applicant: Semiconductor Energy Laboratory Co., Ltd., Atsugi (JP)

(72) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 24 days.

(21) Appl. No.: 13/752,908

(22) Filed: Jan. 29, 2013

(65) Prior Publication Data

US 2013/0215661 A1    Aug. 22, 2013

(30) Foreign Application Priority Data

Feb. 17, 2012  (JP) ................................. 2012-032437

(51) Int. Cl.
  *G11C 5/06*  (2006.01)
  *G11C 11/4097*  (2006.01)

(52) U.S. Cl.
  CPC .................................. *G11C 11/4097* (2013.01)
  USPC ........................................................ 365/72

(58) Field of Classification Search
  CPC .... G11C 11/412; G11C 11/413; G11C 11/24; G11C 14/0054; G11C 5/06; G11C 5/10; H01L 29/42384
  USPC ....................... 365/72, 63, 104, 102, 149, 148
  See application file for complete search history.

(56) References Cited

U.S. PATENT DOCUMENTS

| | | | |
|---|---|---|---|
| 5,568,438 A * | 10/1996 | Penchuk | 365/208 |
| 5,731,856 A | 3/1998 | Kim et al. | |
| 5,744,864 A | 4/1998 | Cillessen et al. | |
| 6,294,274 B1 | 9/2001 | Kawazoe et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Thong Q Le
(74) *Attorney, Agent, or Firm* — Fish & Richardson P.C.

(57) ABSTRACT

Included is a first transistor for controlling rewriting and reading of a first data, a second transistor for controlling rewriting and reading of a second data, a first inverter including an input terminal for the first data, a second inverter including an input terminal for the second data, a third transistor between an output terminal of the second inverter and the input terminal of the first inverter, a fourth transistors between the output of the first inverter and the input terminal of the second inverter, a fifth transistor for controlling rewriting and reading of the first data in the first capacitor, and a sixth transistor for controlling rewriting and reading of the second data in a second capacitor. The first data and the second data are held in the first capacitor and the second capacitor even while power supply is cut off.

5 Claims, 11 Drawing Sheets

(56) References Cited

U.S. PATENT DOCUMENTS

| | | |
|---|---|---|
| 6,563,174 B2 | 5/2003 | Kawasaki et al. |
| 6,665,208 B2 | 12/2003 | Ogura et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,295,079 B2 | 10/2012 | Yamamoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0176357 A1 | 7/2011 | Koyama et al. |
| 2012/0243287 A1* | 9/2012 | Kawasumi ............ 365/72 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-269987 A | 9/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-171723 A | 9/2011 |
| WO | 2004/114391 A1 | 12/2004 |
| WO | 2009/028298 A1 | 3/2009 |
| WO | 2011/089847 A1 | 7/2011 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Develpement of Driver-Integrated Panel Using Amorphous In-Ga-Zn-OxideTFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGa AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic NANO-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, Vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, Vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector with Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGa AMOLED Display Using In-Ga-Zn-Oxide TFTS With A Novel Passivation Layer," SID Digest '09 : SID International Symposium Digest of Technical Papers, May 31, 2009, pp. 284-287.

International Search Report (International Patent Application No. PCT/JP2010/073888) dated Feb. 1, 2011.

Written Opinion (International Patent Application No. PCT/JP2010/073888) dated Feb. 1, 2011.

* cited by examiner

MEMORY CIRCUIT AND SEMICONDUCTOR DEVICE

BACKGROUND OF THE INVENTION

1. Field of the Invention

The present invention relates to a memory circuit. The present invention also relates to a semiconductor device including a cache memory including the memory circuit.

2. Description of the Related Art

In recent years, technical development on high-speed operation has been actively conducted in semiconductor devices including central processing units (also referred to as CPUs) and the like.

For example, a technique in which storage capacitance is increased using a cache memory at the same time as suppressing a decrease in the CPU's operating speed is known.

A cache memory has a function of temporarily storing data in a main memory. The CPU operation is faster than the main memory's response. Thus, by using a cache memory for forming a cache unit, the CPU is not in a wait state and a decrease in the operation speed can be suppressed. In addition, the following technique has been known in recent years: a cache unit has a hierarchical structure of a Level 1 cache, a Level 2 cache, or a Level 3 cache depending on the frequency of using stored data, in order to further suppress a decrease in the CPU's operating speed.

The cache memory is composed of a memory circuit such as a static random access memory (SRAM) (see Patent Document 1, for example).

As another technical development on high-speed operation, down-scaling of semiconductor elements such as transistors is conducted in order to improve the operation speed and the integration of CPUs. For example, a semiconductor device having a semiconductor element with a gate length of 30 nm is manufactured.

However, down-scaling of CPUs increases a leakage current of transistors and power consumption. Conventionally, most of the power consumption of CPUs was power used for arithmetic operation; however, the leakage current of transistors accounts more than 10% of the power consumption due to down-scaling.

For this reason, a method in which power voltage supply to an unused circuit is cut off by using a power gate which is a power supply control switch is supposed to reduce power consumption. This method is also supposed to reduce power consumption in a cache memory.

REFERENCE

Patent Document

[Patent Document 1] Japanese Published Patent Application No. 2002-269987

SUMMARY OF THE INVENTION

However, data stored in an SRAM composing a cache memory is erased when supply of a power voltage is cut off because an SRAM is a volatile memory. In order to solve this problem, data stored in an SRAM has to be held even while power voltage supply is cut off.

As one method for solving this problem, to employ a nonvolatile memory element on an SRAM has been supposed. Since a cache memory needs to operate at high speed for the intended purpose, a flash memory cannot be used as a nonvolatile memory. For this reason, to employ a magnetoresistive random access memory (MRAM) as a nonvolatile memory element has been supposed, for example.

However, an SRAM composed of a conventional nonvolatile memory element has not exhibited sufficient characteristics for practical use yet.

MRAMs, for example, can operate at high speed. However, MRAMs have a problem that the amount of power needed for writing is large, that is, have a dilemma that power consumption is further increased if a period during which supply of a power voltage is cut off is shorter. Note that the amount of write current per cell of an MRAM is said to be 50 to 500 µA.

It is an object of one embodiment of the present invention to hold data even while power voltage supply is cut off. It is another object of one embodiment of the present invention to reduce power consumption.

In one embodiment of the present invention, a memory circuit for storing a first and a second stored data by a first and a second inverters includes a memory unit formed using a transistor with low off-state current. Accordingly, in the case where power voltage supply is cut off, the first and the second stored data is written to the memory unit so that the first and the second data can be held even while the power voltage supply is cut off.

In addition, one embodiment of the present invention includes a transistor for controlling conduction between an input terminal of the first inverter and an output terminal of the second inverter and a transistor for controlling conduction between an output terminal of the first inverter and an input terminal of the second inverter. With this structure, when data stored before the power voltage supply is cut off is read after the power voltage supply is provided, the data can be prevented from being erased due to the first and the second inverters.

One embodiment of the present invention is a semiconductor device including a CPU and the memory circuit as a cache memory. This helps a decrease in power consumption by cutting power voltage supply during a non-operation period.

One embodiment of the present invention is a memory circuit including a first transistor for controlling rewriting and reading of a first stored data by being turned on or off, a second transistor for controlling rewriting and reading of a second stored data by being turned on or off, a first inverter in which a potential of an input terminal thereof is the first stored data, a second inverter in which a potential of an input terminal thereof is the second stored data, a third transistor for controlling conduction between an output terminal of the second inverter and the input terminal of the first inverter by being turned on or off, a fourth transistor for controlling conduction between an output terminal of the first inverter and the input terminal of the second inverter by being turned on or off, a first capacitor to which the first stored data is written as a first held data, a fifth transistor for controlling rewriting and reading of the first held data by being turned on or off, a second capacitor to which the second stored data is written as a second held data, and a sixth transistor for controlling rewriting and reading of the second held data by being turned on or off. Each of the fifth and the sixth transistors has an off-state current of 100 zA or lower per channel width of 1 µm.

Another embodiment of the present invention is a semiconductor device including a cache memory composed of the memory circuit, a CPU having a function of performing arithmetic operation in accordance with an input signal and of reading data of the cache memory in the arithmetic operation, a first power supply control switch for controlling power voltage supply to the CPU, a second power supply control switch for controlling the power voltage supply to the cache memory, and a controller having at least a function of controlling the first and the second power supply control switches independently in accordance with the input signal and an instruction signal inputted from the CPU.

In one embodiment of the present invention, a memory circuit including a transistor with low off-state current helps to hold data even while power voltage supply is cut off. According to one embodiment of the present invention, power voltage supply to a memory circuit can be cut off while write or read operation is not performed; thus, power consumption can be reduced.

DETAILED DESCRIPTION OF THE INVENTION

Embodiment according to the present invention will be described below. Note that it will be readily appreciated by those skilled in the art that details of the embodiments can be modified in various ways without departing from the spirit and scope of the present invention. Thus, the present invention should not be limited to, for example, the description of the following embodiments.

Note that the contents in different embodiments can be combined with one another as appropriate. In addition, the contents of the embodiments can be replaced with each other as appropriate.

Ordinal numbers such as "first" and "second" are used in order to avoid confusion among components, and the number of components is not limited by the number of ordinal numbers.

Embodiment 1

In this embodiment, an example of a memory circuit capable of holding data even while power voltage supply is cut off will be described.

A structure example of the memory circuit of this embodiment will be described with reference to FIGS. 1A and 1B.

Figure 1A:
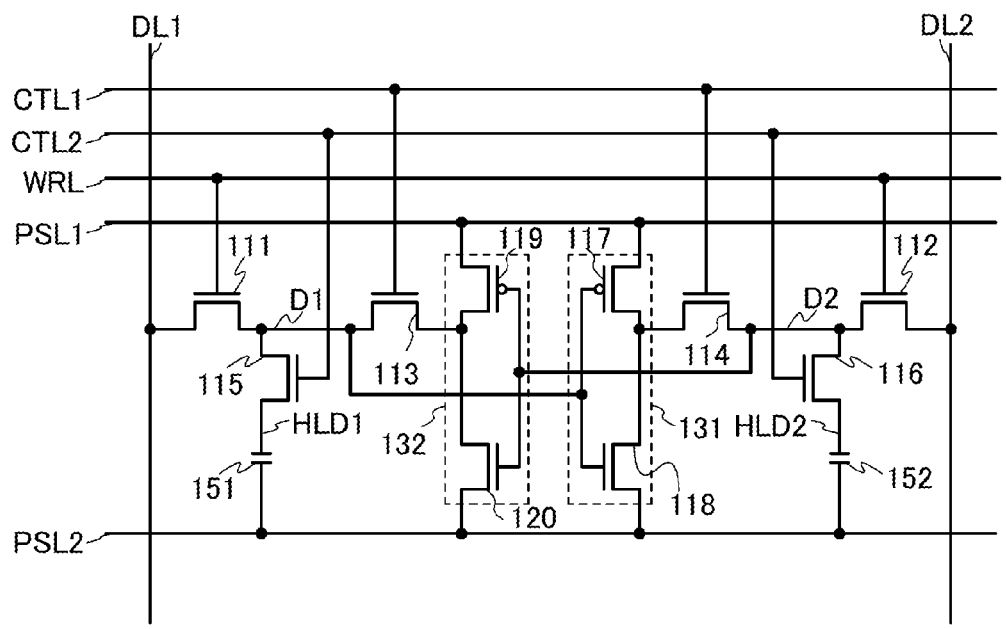
FIGS. 1A and 1B illustrate an example of a memory circuit.
Figure 1B:
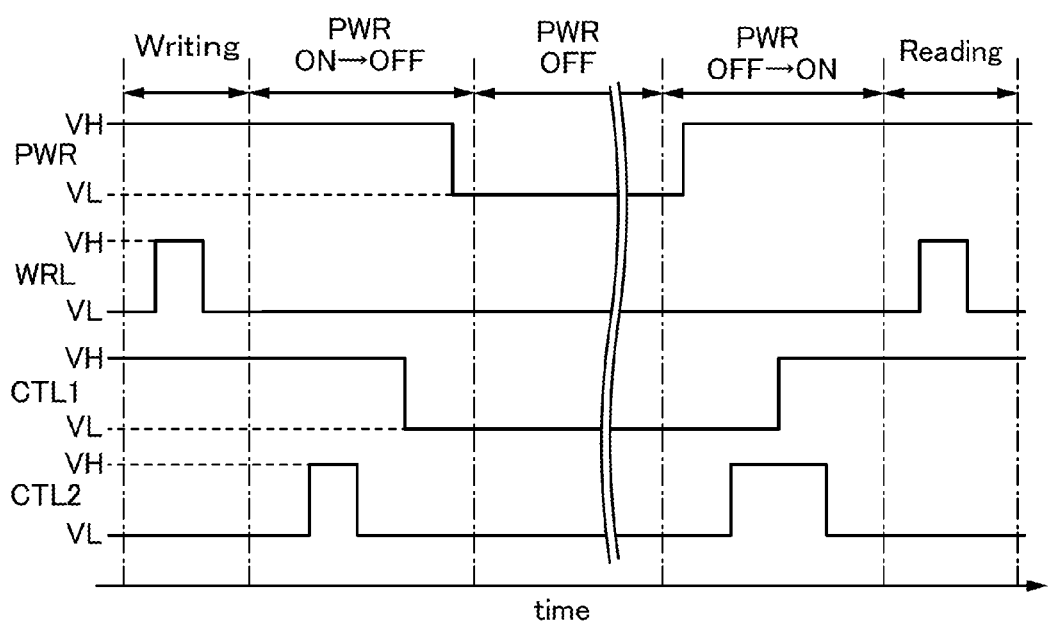

The memory circuit in FIG. 1A includes transistors 111 to 116, an inverter 131 including transistors 117 and 118, an inverter 132 including transistors 119 and 120, and capacitors 151 and 152.

One of a source and a drain of the transistor 111 is electrically connected to a data signal line DL1. A gate of the transistor 111 is electrically connected to a word line WRL.

The transistor 111 has a function of controlling rewriting and reading of a stored data D1 by being turned on or off.

One of a source and a drain of the transistor 112 is electrically connected to a data signal line DL2. A gate of the transistor 112 is electrically connected to a word line WRL.

The transistor 112 has a function of controlling rewriting and reading of a stored data D2 by being turned on or off.

An input terminal of the inverter 131 is electrically connected to the other of the source and the drain of the transistor 111.

In this case, the potential of the input terminal of the inverter 131 is the stored data D1.

The inverter 131 is composed of the transistors 117 and 118. The transistors 117 and 118 are a p-channel transistor and an n-channel transistor, respectively. In this case, one of a source and a drain of the transistor 117 is electrically connected to a potential supply line PSL1. One of a source and a drain of the transistor 118 is electrically connected to a potential supply line PSL2. When a power voltage is supplied, a power voltage PWR is supplied through the potential supply lines PSL1 and PSL2.

The inverter 132 is composed of the transistors 119 and 120. The transistors 119 and 120 are a p-channel transistor and an n-channel transistor, respectively. In this case, one of a source and a drain of the transistor 119 is electrically connected to the potential supply line PSL1. One of a source and a drain of the transistor 120 is electrically connected to the potential supply line PSL2.

Note that the polarity of the transistors 117 and 118 or the polarity of the transistors 119 and 120 may be reversed. In this case, the potentials supplied to the potential supply lines PSL1 and PSL2 are also reversed.

An input terminal of the inverter 132 is electrically connected to the other of the source and the drain of the transistor 112.

In this case, the potential of the input terminal of the inverter 132 is the stored data D2.

One of a source and a drain of the transistor 113 and the other thereof are electrically connected to the input terminal of the inverter 131 and an output terminal of the inverter 132, respectively. A gate of the transistor 113 is electrically connected to a control signal line CTL1. A control signal A is input to the control signal line CTL1.

The transistor 113 has a function of controlling conduction between the output terminal of the inverter 132 and the input terminal of the inverter 131.

One of a source and a drain of the transistor 114 and the other thereof are electrically connected to the input terminal of the inverter 132 and an output terminal of the inverter 131, respectively. A gate of the transistor 114 is electrically connected to the control signal line CTL1.

The transistor 114 has a function of controlling conduction between the output terminal of the inverter 131 and the input terminal of the inverter 132.

One of a pair of electrodes of the capacitor 151 is electrically connected to the potential supply line PSL2.

The stored data D1 as a held data HLD1 is input to the capacitor 151.

One of a pair of electrodes of the capacitor 152 is electrically connected to the potential supply line PSL2.

The stored data D2 as the held data HLD2 is written to the capacitor 152.

The capacitors 151 and 152 serve as storage capacitors for holding data. Note that the capacitors 151 and 152 may be formed using a gate capacitance of a transistor, a parasitic capacitance between a plurality of wirings, or the like.

One of a source and a drain of the transistor 115 and the other thereof are electrically connected to the input terminal of the inverter 131 and the other of the pair of electrodes of the capacitor 151, respectively. A gate of the transistor 115 is electrically connected to a control signal line CTL2. A control signal B is input to the control signal line CTL2.

The transistor 115 has a function of controlling rewriting and reading of the held data HLD1 by being turned on or off.

One of a source and a drain of the transistor 116 and the other thereof are electrically connected to the input terminal of the inverter 132 and the other of the pair of electrodes of the capacitor 152, respectively. A gate of the transistor 116 is electrically connected to the control signal line CTL2.

The transistor 116 has a function of controlling rewriting and reading of the held data HLD2 by being turned on or off.

Transistors with low off-state current, for example, can be used as the transistors 115 and 116.

In this case, the off-state current of the transistor with low off-state current is preferably $1 \times 10^{-19}$ A (100 zA) or lower per channel width of 1 μm.

The transistor with low off-state current can be, for example, a transistor including a channel formation region that includes an oxide semiconductor with a wider bandgap than silicon and is substantially i-type. The transistor including an oxide semiconductor can be fabricated in such a manner, for example, that impurities such as hydrogen and water are reduced as much as possible and oxygen vacancies are reduced as much as possible by supply of oxygen.

Since the transistor including an oxide semiconductor has a wider bandgap, leakage current generated by thermal excitation is low and the number of carriers in a semiconductor layer is extremely small; thus, the off-state current can be lowered. For example, the carrier density of the oxide semiconductor layer can be lower than $1 \times 10^{14}/cm^3$, preferably lower than $1 \times 10^{12}/cm^3$, further preferably lower than $1 \times 10^{11}/cm^3$. The off-state current of the transistor per channel width of 1 μm can be $1 \times 10^{-19}$ A (100 zA) or lower, preferably $1 \times 10^{-22}$ A (100 yA) or lower. It is preferable that the off-state current of the transistor be as low as possible; the lowest value of the off-state current of the transistor is estimated to be about $1 \times 10^{-30}$ A/μm.

By using the transistor with low off-state current as each of the transistors 115 and 116, the capacitors 151 and 152 can hold data even while power voltage supply is cut off.

In addition, a write current of the memory circuit in FIG. 1A is preferably low.

For example, the write current of the memory circuit in FIG. 1A can be 10 μA or lower, preferably 1 μA or lower. A calculation example will be described below.

For example, an on-state resistance of a transistor in a linear region can be obtained by the following formula (1).

$$Rd = \frac{Vd}{Id} = \frac{Vd}{\frac{W}{L} \mu Cox\left\{(Vg - Vth)Vd - \frac{1}{2}Vd^2\right\}} \quad (1)$$

In the formula (1), Rd is an on-state resistance of a transistor, Id is a current (also referred to as drain current) flowing between a source and a drain of the transistor, Vd is a voltage (also referred to as drain voltage) between the source and the drain of the transistor, L is a channel length of the transistor, W is a channel width of the transistor, μ is a mobility of the transistor, Cox is a gate capacitance of the transistor, Vg is a voltage (also referred to as gate voltage) between a gate and the source of the transistor, and Vth is a threshold voltage of the transistor.

Here, each of the transistors 111, 112, 115, and 116, for example, is set as follows on the basis of the specification example of the memory circuit: the mobility μ is 10 $cm^2/Vs$; the gate capacitance Cox is $1.82 \times 10^{-3}$ $F/m^2$; the threshold voltage Vth is 0.5 V; the channel length L is 1 μm; the channel width W is 1 μm; each potential of the word line WRL and the control signal line CTL1 is 3.3 V; and the potential of the data signal line DL1 or DL2 is 1.8 V. In this case, the resistance Rd between the source and the drain is about 300 kΩ. Since the potential of the data signal line DL1 or DL2 is 1.8 V, the average value of the write current corresponding to the data signal line DL1 or DL2 is 3 μA obtained by 1.8 V/(300 kΩ×2). About 1 fF is enough for each capacitance of the capacitors 151 and 152. In this case, the time taken to put the capacitor 151 or 152 to a steady state is 0.6 nsec obtained by $(1.8 \times 1 \times 10^{-15})/3 \times 10^{-6}$. Thus, the write current needed to put the capacitor 151 or 152 to the steady state is lower than the average value; it can be 1 μA or lower, for example.

As described in the above example, since the write current of the memory circuit of this embodiment can be lowered, power consumption of the memory circuit can be reduced.

As each of the transistors 111 to 114 and the transistors 117 to 120, a transistor in which a channel is formed and which includes a semiconductor layer containing silicon can be used, for example. One embodiment of the present invention is not limited to this, and transistors which can be employed as the transistors 115 and 116 may be used as the transistors 111 to 114.

The above is the description of the configuration example of the memory circuit illustrated in FIG. 1A.

Next, an example of a method for driving the memory circuit illustrated in FIG. 1A will be described with reference to a timing chart in FIG. 1B, as an example of a method for driving the memory circuit in this embodiment. Note that the transistors 111 to 114 are n-channel transistors. The potential of a high-level signal is a potential VH. The potential of a low-level signal is a potential VL. The potential of the potential supply line PSL1 is the potential VH. The potential of the potential supply line PSL2 is the potential VL. A double wavy line in FIG. 1B represents omission.

In the example of a method for driving the memory circuit shown in FIG. 1A, the power voltage PWR is supplied during a writing period ("Writing") and the potentials of the data signal lines DL1 and DL2 are determined. In this case, one of the data signal lines DL1 and DL2 and the other thereof are the potential VH and the potential VL, respectively. One of the potentials VH and VL is referred to as data "1" and the other thereof is data "0".

In addition, the potential of the word signal line WRL is set to the potential VH to turn on the transistors 111 and 112. The potential of the control signal line CTL1 is set to the potential VH to turn on the transistors 113 and 114. Further, the potential of the control signal line CTL2 is set to the potential VL to turn off the transistors 115 and 116.

In this case, the potential of the data signal line DL1 is written as the stored data D1, and the potential of the data signal line DL2 is written as the stored data D2.

Then, the potential of the word signal line WRL is set to the potential VL to turn off the transistors 111 and 112; accordingly, the stored data D1 and D2 are held.

In addition, during a transition period for power-off ("PWR ON→OFF"), the word signal line WRL is set at the potential VL to turn off the transistors 111 and 112 while the power voltage PWR is kept supplied. The potential of the control signal line CTL2 is set to the potential VH to turn on the transistors 115 and 116 while the transistors 113 and 114 are kept on by setting the control signal line CTL1 at the potential VH.

In this case, the stored data D1 as the held data HLD1 is input to the capacitor 151. The stored data D2 as the held data HLD2 is input to the capacitor 152.

Further, the transistors 115 and 116 are turned off by setting the potential of the control signal line CTL2 to the potential VL, so that the held data HLD1 and HLD2 are held.

After that, the potential of the control signal line CTL1 is set to the potential VL to turn off the transistors 113 and 114, so that supply of the power voltage PWR to the memory circuit is cut off. For example, the supply of the power voltage PWR to the memory circuit can be cut off by cutting supply of the potential through at least one of the potential supply lines PSL1 and PSL2 using a power supply control switch called power gate.

During a power-off period ("PWR OFF"), the held data HLD1 of the capacitor 151 and the held data HLD2 of the capacitor 152 are kept held even while the supply of the power voltage PWR to the memory circuit is cut off.

During a transition period for providing power supply ("PWR OFF→ON"), the supply of the power voltage PWR to the memory circuit is provided, and then, the potential of the control signal line CTL2 is set to the potential VH to turn on the transistor 115 and 116 while the transistors 111 to 114 are kept OFF by setting the word signal line WRL and the control signal line CTL1 to the potential VL.

In this case, the held data HLD1 of the capacitor 151 and the held data HLD2 of the capacitor 152 are read as the stored data D1 and the stored data D2, respectively.

Note that even when the potentials of the output terminals of the inverters 131 and 132 become indeterminate values just after the power voltage supply to the memory circuit is provided, the held data HLD1 and HLD2 can be read without erased because the transistors 113 and 114 are turned off at this time.

In this manner, the conduction control of the transistors 113 and 114 when the power voltage supply is provided prevents the held data HLD1 and HLD2 from being erased.

After that, the potential of the word signal line WRL is set at the potential VL and the transistors 111 and 112 are turned off, the potential of the control signal line CTL1 is set to the potential VH to turn on the transistors 113 and 114, and the potential of the control signal line CTL2 is set to the potential VL to turn off the transistors 115 and 116; accordingly, the stored data D1 and D2 are held by the inverters 131 and 132.

During a reading period ("Reading"), the potential of the word signal line WRL is set to the potential VH to turn on the transistors 111 and 112. Further, the transistors 113 and 114 are turned on by setting the potential of the control signal line CTL1 to the potential VH. In addition, the potential of the control signal line CTL2 is set to the potential VL to turn off the transistors 115 and 116.

At this time, the potentials of the data signal lines DL1 and DL2 are determined in accordance with the potentials of the stored data D1 and D2, respectively. Accordingly, the stored data D1 and D2 stored in the memory circuit are read.

Note that the reading period may be put between the rewriting period and the transition period for power-off.

The above is the description of an example of a method for driving the memory circuit illustrated in FIG. 1A.

Note that the configuration of the memory circuit in this embodiment is not limited to the configuration in FIG. 1A.

Figure 2A:
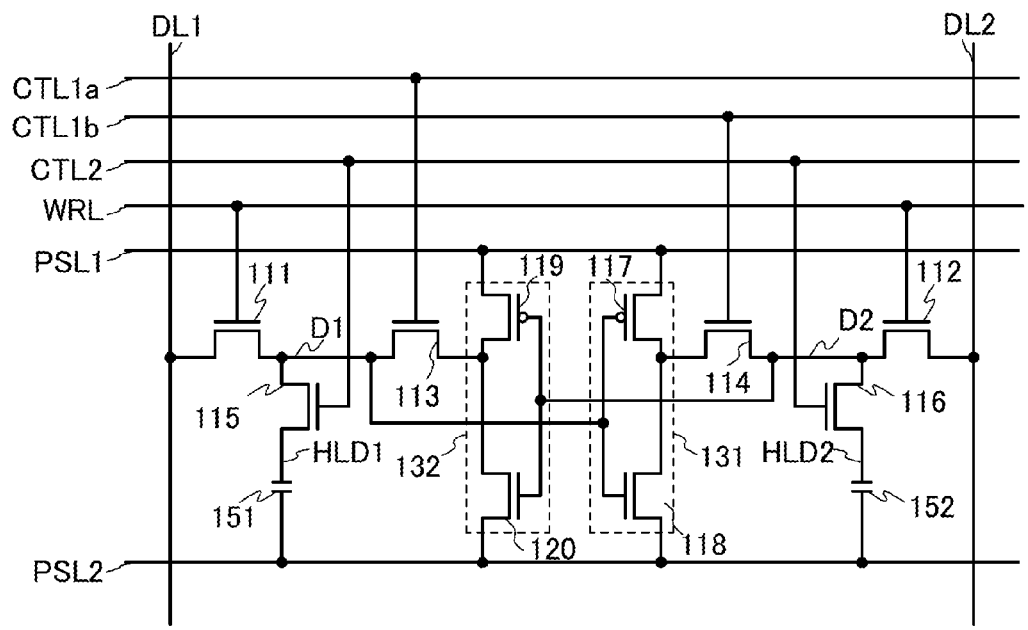
FIGS. 2A and 2B illustrate an example of a memory circuit.

For example, in a memory circuit shown in FIG. 2A, the gate of the transistor 113 in the memory circuit in FIG. 1A is electrically connected to a control signal line CTL1a instead of the control signal line CTL1 and the gate of the transistor 114 is electrically connected to a control signal line CTL1b instead of the control signal line CTL1.

In this case, a first control signal A and a second control signal A are input to the gate of the transistor 113 and the gate of the transistor 114, respectively.

Figure 2B:
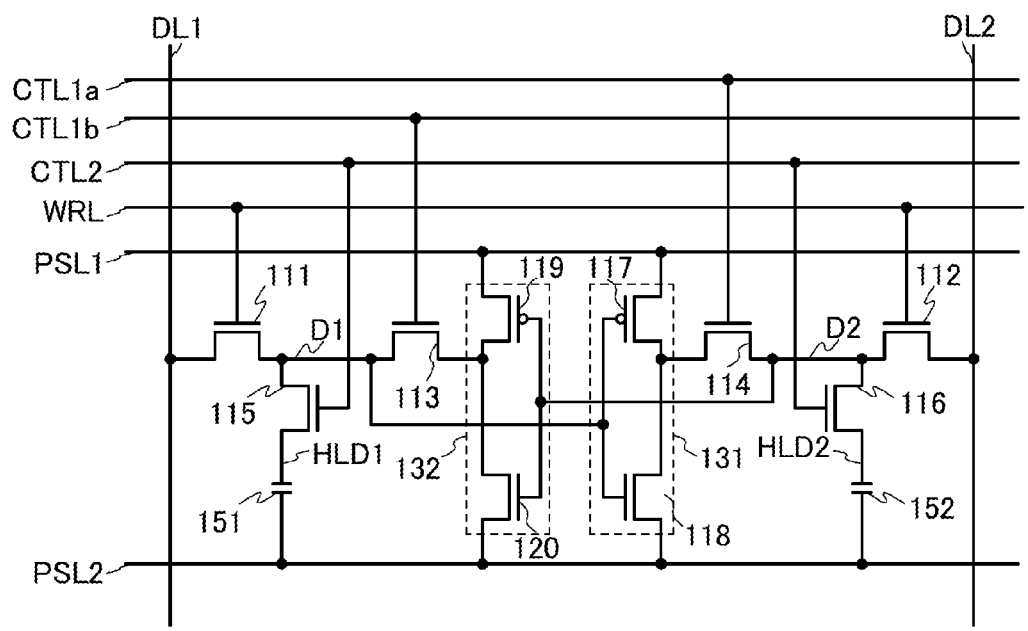

Alternatively, the configuration in FIG. 2B in which the gate of the transistor 113 and the gate of the transistor 114 are electrically connected to the control signal line CTL1b and the control signal line CTL1a, respectively may be employed. In this case, the second control signal A and the first control signal A are input to the gate of the transistor 113 and the gate of the transistor 114, respectively.

Figure 3:
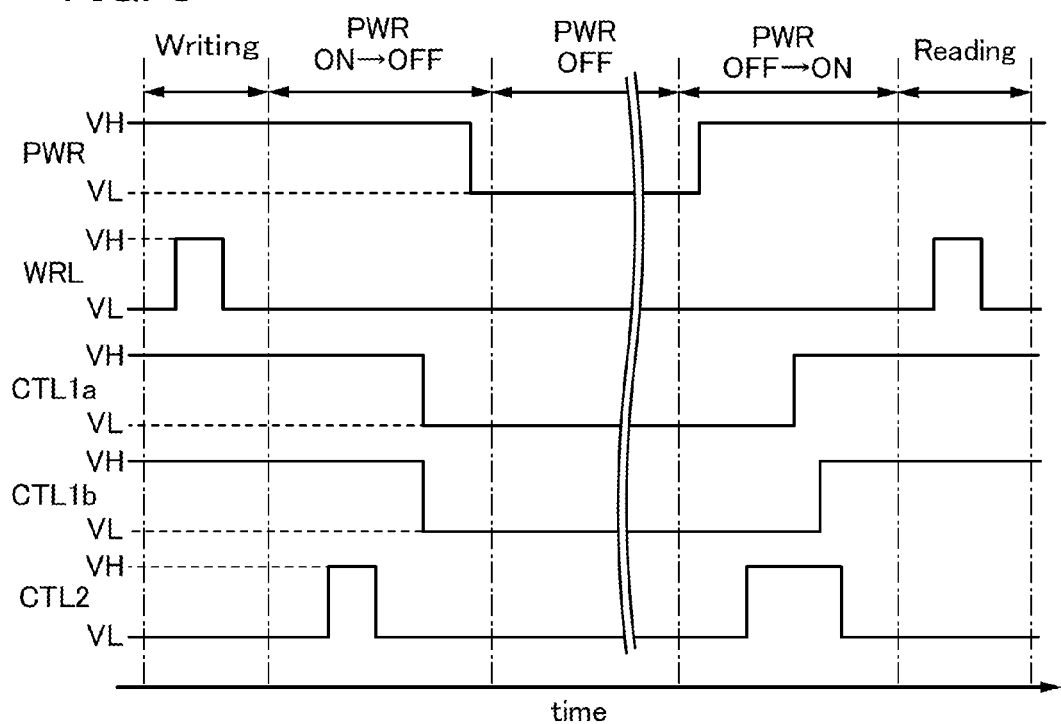
FIG. 3 illustrates a timing chart for explaining an example of a method for driving a memory circuit.

Further, an example of a method for driving the memory circuits in FIGS. 2A and 2B is different from the example of a method for driving the memory circuit in FIG. 1A in operation during the transition period for providing power supply. Here, an example of a method for driving the memory circuit in FIG. 2A will be described as an example, with reference to a timing chart in FIG. 3.

During the transition period for providing power supply, when the potential of the control signal line CTL1b is the potential VL, the potential of the control signal line CTL1a is set to the potential VH to turn on the transistor 113. Then, the potential of the control signal line CTL1b is set to the potential VH to turn on the transistor 114.

Since there is a gap between the timing of turning the transistor 113 on and the timing of turning the transistor 114 on, the potentials of the output terminals of the inverters 131 and 132 can be further stable when the power voltage supply is provided.

The above is the description of an example of the memory circuit in this embodiment.

As described with reference to FIGS. 1A and 1B, FIGS. 2A and 2B, and FIG. 3, the examples of the memory circuit of this embodiment include a memory unit using transistors with low off-state current.

For this reason, even while the power voltage supply to a memory circuit is cut off, data can be held. Thus, the power voltage supply to a memory circuit is cut off when write or read operation to the memory circuit is not performed to reduce power consumption.

In the examples of the memory circuit of this embodiment, the memory circuit includes a transistor (e.g., the transistor 113) controlling conduction between an input terminal of a first inverter (e.g., the inverter 131) and an output terminal of a second inverter (e.g., the inverter 132) and a transistor (e.g., the transistor 114) controlling conduction between an input terminal of the second inverter and an output terminal of the first inverter.

Accordingly, when a first held data (e.g., the held data HLD1) of a first capacitor (e.g., the capacitor 151) is read as a first stored data (e.g., the stored data D1) after the power voltage supply is provided and a second held data (e.g., the held data HLD2) of a second capacitor (e.g., the capacitor 152) is read as a second stored data (e.g., the stored data D2), the first and second held data can be prevented from being erased owing to the inverters 131 and 132.

Embodiment 2

In this embodiment, a structure example of the memory circuit in the Embodiment 1 will be described.

First, a structure example of a transistor which can be employed to the memory circuit will be described with reference to cross-sectional schematic views in FIGS. 4A to 4C. Note that components illustrated in FIGS. 4A to 4C are not to scale in some cases.

Figure 4A:
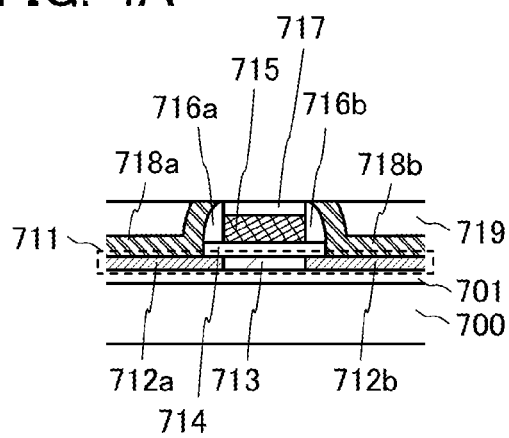
FIGS. 4A to 4C are cross-sectional schematic views each illustrating an example of a transistor.
Figure 4B:
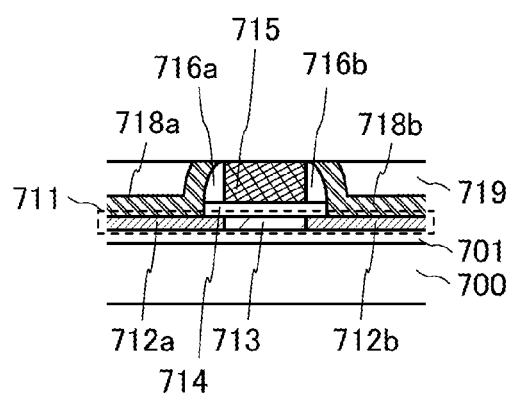
Figure 4C:
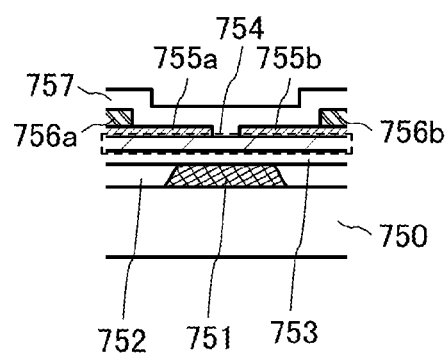

The transistor in FIG. 4A includes a semiconductor layer 711, an insulating layer 714, a conductive layer 715, insulating layers 716a and 716b, an insulating layer 717, conductive layers 718a and 718b, and an insulating layer 719.

The semiconductor layer 711 is positioned over an element formation layer 700 with the insulating layer 701 interposed therebetween. Note that the semiconductor layer 711 is not necessarily provided over the insulating layer 701 and may be provided directly on the element formation layer 700.

The semiconductor layer 711 includes separate regions 712a and 712b to which dopants are added, and a channel formation region 713 between the regions 712a and 712b.

The insulating layer 714 is positioned over part of the semiconductor layer 711.

The conductive layer 715 overlaps with the semiconductor layer 711 with the insulating layer 714 interposed therebetween.

The insulating layer 716a is provided in contact with one of a pair of side surfaces of the conductive layer 715. The insulating layer 716b is provided in contact with the other thereof.

The insulating layer 717 is positioned over the conductive layer 715. Note that the insulating layer 717 is not necessarily provided as shown in FIG. 4B.

The conductive layers 718a and 718b are in contact with the regions 712a and 712b, respectively. Further, the conductive layers 718a and 718b are in contact with a side surface of the insulating layer 716a and that of the insulating layer 716b, respectively.

The insulating layer 719 is positioned over the conductive layers 718a and 718b.

The conductive layers 718a and 718b and the insulating layer 719 are formed in such a manner that a stacked-layer of a conductive film and an insulating layer is subjected to a planarization treatment (e.g., CMP treatment), for example.

The transistor in FIG. 4C includes a conductive layer 751, an insulating layer 752, an insulating layer 753, a semiconductor layer 754, conductive layers 755a and 755b, conductive layers 756a and 756b, and an insulating layer 757.

The conductive layer 751 is positioned over an element formation layer 750.

The insulating layer 752 is provided over an element formation layer 750. Surfaces of the insulating layer 752 and the conductive layer 751 are preferably flat.

The conductive layer 751 and the insulating layer 752 are formed in such a manner that a stacked-layer of a conductive film and an insulating layer is subjected to a planarization treatment (e.g., CMP treatment), for example.

The insulating layer 753 is positioned over the conductive layer 751 and the insulating layer 752.

The semiconductor layer 754 overlaps with the conductive layer 751 with the insulating layer 753 interposed therebetween.

The conductive layers 755a and 755b are separated from each other and are electrically connected to the semiconductor layer 754. Here, the distance between the conductive layers 755a and 755b corresponds to the channel length of the transistor and is preferably less than 50 nm, for example. The distance between the conductive layers 755a and 755b can be made shorter than 50 nm in such a manner that part of a conductive film is etched using a resist mask formed by electron beam exposure. In addition, the distance between the conductive layers 755a and 755b is preferably less than the distance between the conductive layers 756a and 756b, for example.

The conductive layer 756a is positioned on and in contact with part of the conductive layer 755a, and the conductive layer 756b is positioned on and in contact with part of the conductive layer 755b. The electrical resistance of the conductive layers 756a and 756b is preferably lower than that of the conductive layers 755a and 755b.

The insulating layer 757 is positioned over the semiconductor layer 754 to cover an upper surface of the semiconductor layer 754.

The components will be described in detail below. Each of the components is not limited to a single layer and may be a stacked-layer.

The insulating layer 701 is a base layer. The insulating layer 701 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

The insulating layer 752 can be a layer containing a material similar to that of the insulating layer 701.

Each of the semiconductor layers 711 and 754 functions as a layer in which a channel of the transistor is formed (also referred to as a channel formation layer).

As the semiconductor layers 711 and 754, an oxide semiconductor layer can be used, for example.

An oxide semiconductor layer may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Alternatively, the oxide semiconductor layer may be a stacked-layer of an amorphous layer and a layer including crystals.

As an oxide semiconductor that can be applied to the oxide semiconductor layer, metal oxide containing zinc and one or both of indium and gallium, metal oxide containing another metal element instead of part or all of gallium in the given metal oxide, or the like can be given.

For example, In-based metal oxide, Zn-based metal oxide, In—Zn-based metal oxide, In—Ga—Zn-based metal oxide, or the like can be used as the metal oxide. Alternatively, metal oxide including another metal element instead of part or all of Ga (gallium) in the In—Ga—Zn-based metal oxide may be used.

As the aforementioned another metal element, a metal element that is capable of combining with more oxygen atoms than gallium can be used. For example, one or more elements of titanium, zirconium, hafnium, germanium, and tin can be used. Alternatively, as the aforementioned another metal element, one or more elements of lanthanum, cerium, praseodymium, neodymium, samarium, europium, gadolinium, terbium, dysprosium, holmium, erbium, thulium, ytterbium, and lutetium can be used. These metal elements function as a stabilizer. Note that the additive amount of such a metal element is determined so that the metal oxide can function as a semiconductor. When a metal element that is capable of combining with more oxygen atoms than gallium is used and oxygen is supplied to a metal oxide, oxygen defects in the metal oxide can be reduced.

For example, when tin is used instead of all of Ga (gallium) contained in the In—Ga—Zn-based metal oxide, an In—Sn—Zn-based metal oxide is obtained. When Ti (titanium) replaces part of Ga (gallium) contained in the In—Ga—Zn-based metal oxide, an In—Ti—Ga—Zn-based metal oxide is obtained.

The oxide semiconductor layer may be an oxide semiconductor layer including a CAAC-OS (c-axis aligned crystalline oxide semiconductor).

The oxide semiconductor layer including a CAAC-OS is not completely amorphous. The oxide semiconductor layer including a CAAC-OS, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the oxide semiconductor layer including a CAAC-OS are not clearly detected. Further, with the TEM, a grain boundary in the oxide semiconductor layer including a CAAC-OS is not clearly found. Thus, in the oxide semiconductor layer including a CAAC-OS, a reduction in electron mobility due to the grain boundary is suppressed. In each of the crystal parts, for example, a c-axis is aligned in a direction parallel to a normal vector of a surface where the oxide semiconductor layer including a CAAC-OS is formed or a normal vector of a surface of the oxide semiconductor layer including a CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that, among crystal parts, the directions of the a-axis and the b-axis of one crystal part may be different from those of another crystal part. In this specification, a simple term "perpendicular" includes a range from 80° to 100°, preferably from 85° to 95° In addition, a simple term "parallel" includes a range from −10° to 10°, preferably from −5° to 5°.

In a field-effect transistor including an oxide semiconductor layer which contains the CAAC-OS and serves as a channel formation layer, variations in electrical characteristics due to irradiation with visible light and ultraviolet light are small; therefore, the reliability is high.

For example, an oxide semiconductor layer may include microcrystal. Note that an oxide semiconductor including microcrystal is referred to as a microcrystalline oxide semiconductor. A microcrystalline oxide semiconductor layer includes microcrystal (also referred to as nanocrystal) with a size greater than or equal to 1 nm and less than 10 nm, for example. Alternatively, a microcrystalline oxide semiconductor layer, for example, includes a crystal-amorphous mixed phase structure where crystal parts with each size greater than or equal to 1 nm and less than 10 nm are distributed.

For example, an oxide semiconductor layer may include an amorphous part. Note that an oxide semiconductor including an amorphous part is referred to as an amorphous oxide semiconductor. An amorphous oxide semiconductor layer, for example, has disordered atomic arrangement and no crystalline component. Alternatively, an amorphous oxide semiconductor layer is, for example, absolutely amorphous and has no crystal part.

Note that an oxide semiconductor layer may be a mixed layer including any of a CAAC-OS, a microcrystalline oxide semiconductor, and an amorphous oxide semiconductor. The mixed layer, for example, includes a region of an amorphous oxide semiconductor, a region of a microcrystalline oxide semiconductor, and a region of a CAAC-OS. Further, the mixed layer may have a stacked structure including a region of an amorphous oxide semiconductor, a region of a microcrystalline oxide semiconductor, and a region of a CAAC-OS, for example.

Note that in the oxide semiconductor layer including a CAAC-OS, distribution of crystal parts is not necessarily uniform. For example, in the formation process of the CAAC-OS, in the case where crystal growth occurs from a surface side of the oxide semiconductor layer, the proportion of crystal parts in the vicinity of the surface of the oxide semiconductor layer is higher than that in the vicinity of the surface where the oxide semiconductor layer is formed in some cases. Further, when an impurity is added to the oxide semiconductor layer including a CAAC-OS, the crystal part in a region to which the impurity is added becomes amorphous in some cases.

In the case where an oxide semiconductor layer is used as the semiconductor layers 711 and 754, the oxide semiconductor layer can be highly purified, for example, in the following manner: dehydration or dehydrogenation is performed so that impurities such as hydrogen, water, a hydroxyl group, and a hydride (also referred to as hydrogen compound) are removed from the oxide semiconductor layer, and oxygen is supplied to the oxide semiconductor layer. For example, a layer containing oxygen is used as the layer in contact with the oxide semiconductor layer, and heat treatment is performed; thus, the oxide semiconductor layer can be highly purified.

In addition, the oxide semiconductor layer that has just been formed is preferably supersaturated with oxygen so that the proportion of oxygen is higher than that in the stoichiometric composition. For example, in the case of using sputtering, the oxide semiconductor layer is preferably formed under the condition where the proportion of oxygen in a deposition gas is large, and particularly in an oxygen atmosphere (e.g., oxygen gas: 100%).

The oxide semiconductor layer may be formed by a sputtering method at the substrate temperature of higher than or equal to 100° C. and lower than or equal to 500° C., preferably higher than or equal to 200° C. and lower than or equal to 350° C.

Further, in order to sufficiently supply oxygen to supersaturate the oxide semiconductor layer with oxygen, an insulating layer (e.g., the insulating layers 701, 714, 753, and 757) which contains excess oxygen may be provided as the insulating layer in contact with the oxide semiconductor layer.

For example, the insulating layer containing excess oxygen can be formed as follows: the insulating layer is deposited using a sputtering method under the deposition conditions such that a large amount of oxygen is contained in the film. In order to make the insulating layer contain much more excess oxygen, oxygen may be added by an ion implantation method, an ion doping method, or plasma treatment. Moreover, oxygen may be added to the oxide semiconductor layer.

In a sputtering apparatus, the amount of moisture remaining in a deposition chamber is preferably small. Therefore, an entrapment vacuum pump is preferably used in the sputtering apparatus. Further, a cold trap may be used.

In manufacture of the transistor, heat treatment is preferably performed. A temperature of the heat treatment is preferably higher than or equal to 350° C. and lower than the strain point of the substrate, preferably higher than or equal to 350° C. and lower than or equal to 450° C. Note that the heat treatment may be performed more than once.

There is no particular limitation on a heat treatment apparatus to be used for the heat treatment, and a rapid thermal annealing (RTA) apparatus such as a gas rapid thermal annealing (GRTA) apparatus or a lamp rapid thermal annealing (LRTA) apparatus may be used. Alternatively, another heat treatment apparatus such as an electric furnace may be used.

After the heat treatment, a high-purity oxygen gas, a high-purity $N_2O$ gas, or ultra-dry air (having a dew point of −40° C. or lower, preferably −60° C. or lower) is preferably introduced in the furnace where the heat treatment has been performed while the heating temperature is being maintained or being decreased. In this case, it is preferable that the oxygen gas or the $N_2O$ gas do not contain water, hydrogen, and the like. The purity of the oxygen gas or the $N_2O$ gas which is introduced into the heat treatment apparatus is preferably 6N or higher, more preferably 7N or higher. That is, the impurity concentration of the oxygen gas or the $N_2O$ gas is preferably 1 ppm or lower, more preferably 0.1 ppm or lower. Through this step, oxygen is supplied to the oxide semiconductor layer, and defects due to oxygen vacancies in the oxide semiconductor layer can be reduced. Note that the high-purity oxygen gas, high-purity $N_2O$ gas, or ultra-dry air may be introduced at the time of the above heat treatment.

The hydrogen concentration of the highly purified oxide semiconductor layer, measured by secondary ion mass spectrometry (also referred to as SIMS), is $5\times10^{19}$ atoms/cm$^3$ or lower, preferably $5\times10^{18}$ atoms/cm$^3$ or lower, more preferably $5\times10^{17}$ atoms/cm$^3$ or lower.

With the use of the highly purified oxide semiconductor, the carrier density of the oxide semiconductor layer in a field-effect transistor can be lower than $1\times10^{14}$/cm$^3$, preferably lower than $1\times10^{12}$/cm$^3$, further preferably lower than $1\times10^{11}$/cm$^3$. Such a low carrier density can reduce the off-state current of the field-effect transistor per micrometer of channel width to $1\times10^{-19}$ A (100 zA) or less, preferably $1\times10^{-22}$ A (100 yA) or less. It is preferable that the off-state current of the field-effect transistor be as low as possible; the lower limit of the off-state current of the field-effect transistor is estimated to be approximately $1\times10^{-30}$ A/μm.

As the dopants contained in the regions 712a and 712b, it is possible to use an element of Group 13 in the periodic table (e.g., boron), an element of Group 15 in the periodic table (e.g., one or more of nitrogen, phosphorus, and arsenic), and/or a rare gas element (e.g., one or more of helium, argon, and xenon), for example. The dopants can be selected from at least one of these groups.

Each of the insulating layers 714 and 753 functions as a gate insulating layer of the transistor. As each of the insulating layers 714 and 753, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide can be used.

Each of the conductive layers 715 and 751 functions as a gate of the transistor. As each of the insulating layers 715 and 751, for example, a layer containing a metal material such as molybdenum, titanium, chromium, tantalum, magnesium, silver, tungsten, aluminum, copper, neodymium, or scandium can be used.

Each of the insulating layers 716a, 716b, and 717 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

Each of the conductive layers 718a and 718b, the conductive layers 755a and 755b, and the conductive layers 756a and 756b functions as a source or a drain of the transistor. Each of the conductive layers 718a and 718b, the conductive layers 755a and 755b, and the conductive layers 756a and 756b can be, for example, a layer containing a metal material such as molybdenum, titanium, chromium, tantalum, magnesium, silver, tungsten, aluminum, copper, neodymium, scandium, or ruthenium.

The insulating layers 719 and 757 each function as a protective layer. Each of the insulating layers 719 and 757 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

In addition, Id-Vg characteristics of an example of the transistor illustrated in FIG. 4B will be described as electrical characteristics of an example of the transistor, with reference to FIG. 5. Note that in the transistor exhibiting the Id-Vg characteristics shown in FIG. 5, the semiconductor layer 711 is a 20-nm-thick In—Ga—Zn-based oxide semiconductor layer, the insulating layer 714 is a 20-nm-thick silicon oxynitride layer, the conductive layer 715 is a stacked-layer of a 30-nm-thick tantalum nitride layer and a 200-nm-thick tungsten layer, and each of the conductive layers 718a and 718b is a 30-nm-thick tungsten layer. In addition, phosphorus is added to form the regions 712a and 712b. The amount of added phosphorus is $1\times10^{15}$ cm$^{-2}$ and the acceleration voltage is 30 kV. Further, the channel length is 5 μm and the channel width is 10 μm. The horizontal axis indicates the gate voltage Vg and the vertical axis indicates the drain current Id or the field-effect mobility μFE.

Figure 5:
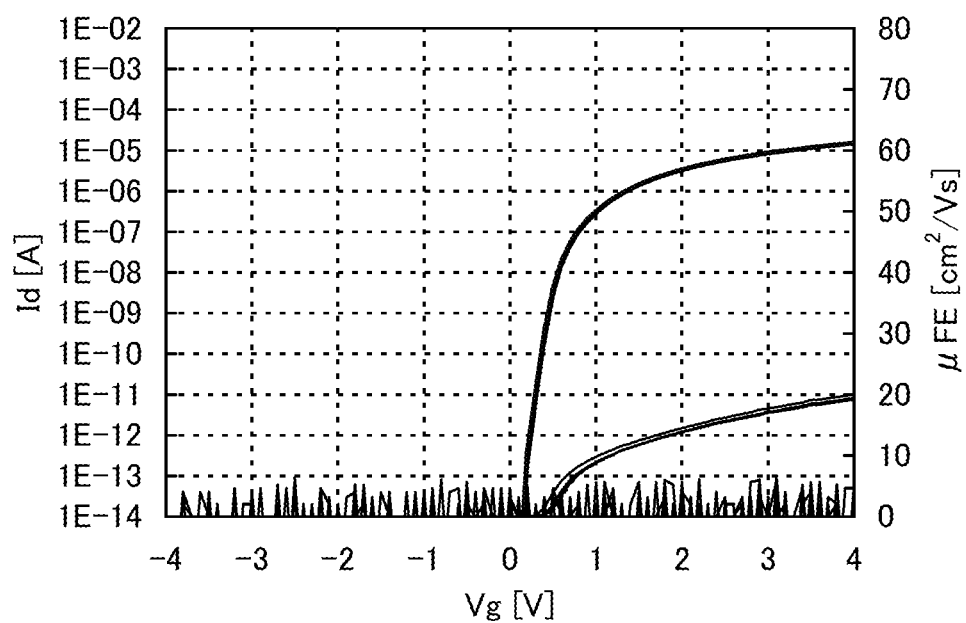
FIG. 5 shows Id-Vg characteristics of a transistor.

In the transistor exhibiting the Id-Vg characteristics shown in FIG. 5, the field-effect mobility is about 20 cm$^2$/Vs, the off-state current is under the detection limit, and the threshold voltage is higher than or equal to 0 V.

Further, the value of the on-state resistance of the transistor exhibiting the Id-Vg characteristics shown in FIG. 5 is calculated with reference to the formula (1) in Embodiment 1.

When the relative permittivity of the insulating layer 714 is 4.1, the gate capacitance Cox is $1.82\times10^{-3}$ F/m$^2$. Further, when the mobility of the transistor μ is 20 cm$^2$/Vs and the threshold voltage Vth is 0.6 V according to the data in FIG. 5 and when the gate voltage Vg is 3.3 V and the drain voltage Vd is 1.8 V as the specification example of the memory circuit, the on-state resistance Rd is 76.3 kΩ from the formula (1) in Embodiment 1.

The above is the description of a structure example of the transistors illustrated in FIGS. 4A to 4C.

Figure 6A:
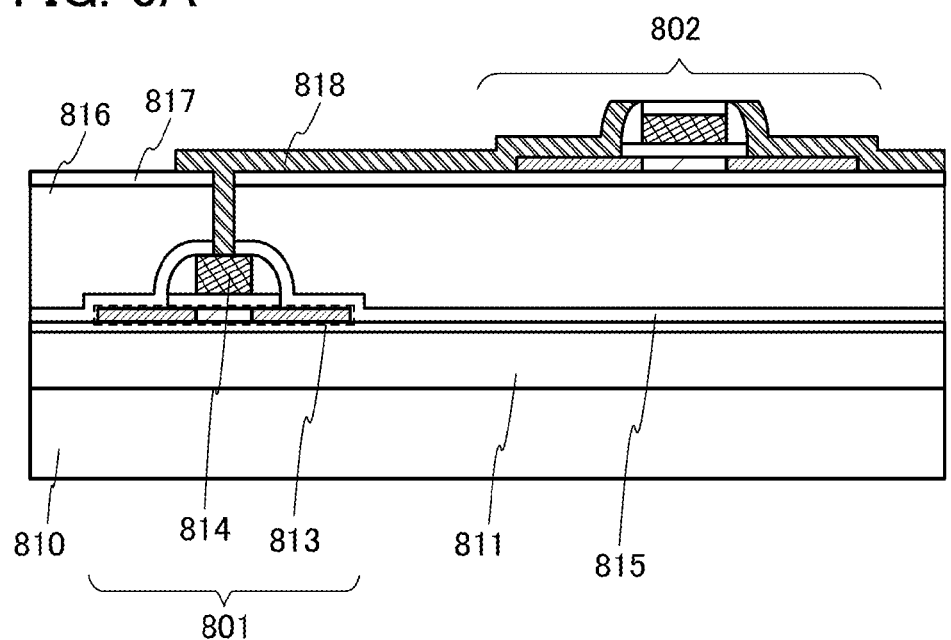
FIGS. 6A and 6B are cross-sectional schematic views each illustrating an example of a structure of a memory circuit.
Figure 6B:
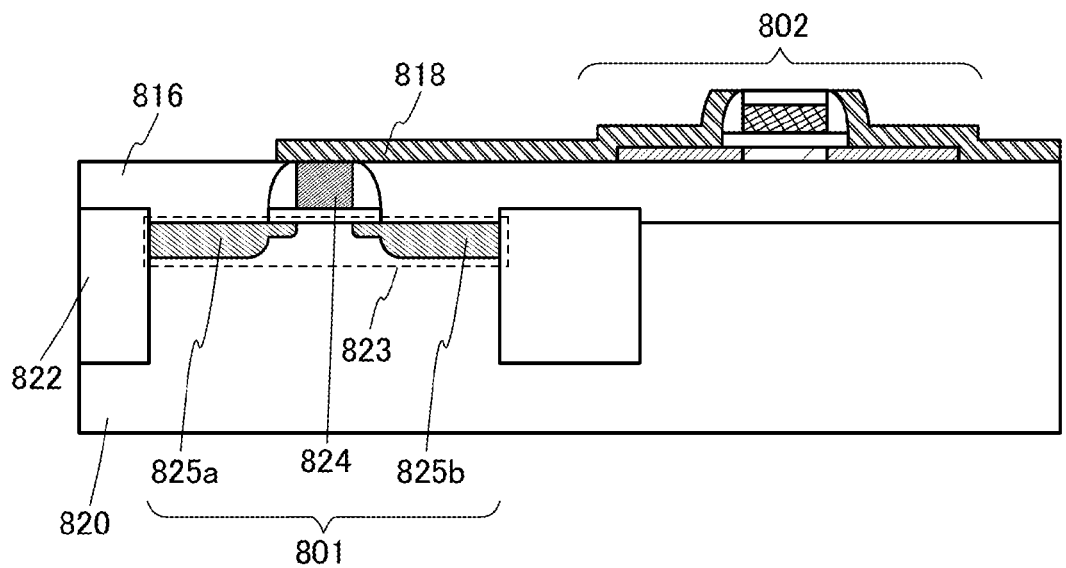

Further, a structure example of a memory circuit in the case of using the transistor in FIG. 4A will be described with reference to FIGS. 6A and 6B. FIGS. 6A and 6B are cross-sectional schematic views illustrating the structure examples of the memory circuit in this embodiment. Note that one embodiment of the present invention is not limited thereto; a memory circuit may be formed using the transistors illustrated in FIGS. 4B and 4C.

The semiconductor device illustrated in FIG. 6A includes a transistor 801 including a single crystal silicon layer 813 that is a channel formation layer, and a transistor 802 that is stacked over the transistor 801 with insulating layers 815 to 817 placed therebetween and has the structure illustrated in FIG. 4A. Note that the description of the transistor illustrated in FIG. 4A can apply to the transistor 802 as appropriate.

The single crystal silicon layer 813 is provided over a substrate 810 with an insulating layer (also referred to as BOX layer) 811 placed therebetween. Note that as illustrated in FIG. 6B, the transistor 801 may be composed of a semiconductor region 823 surrounded by a buried insulating region 822 in a single crystal semiconductor substrate 820, instead of using the substrate 810, the insulating layer 811, and the single crystal silicon layer 813. In this case, in the semiconductor region 823, impurity regions 825a and 825b whose conductivity is n-type or p-type are provided.

The insulating layer 815 serves as a protective layer. The insulating layer 816 functions both as a protective layer and as a planarization layer. The insulating layer 817 functions as a base layer. Each of the insulating layers 815 to 817 can be a layer containing a material similar to that of the insulating layer 701 illustrated in FIG. 4A.

A conductive layer 818 functioning as a source or a drain of the transistor 802 is connected to a conductive layer 814 functioning as a gate of the transistor 801. Note that the conductive layer 818 and the conductive layer 814 may be connected to each other through a plurality of conductive layers. Note that the memory circuit may have the structure as shown in FIG. 6B in which the conductive layer 824 serving as the gate of the transistor 801 has a direct contact with the conductive layer 818. Alternatively, the conductive layer 818 may be electrically connected to the conductive layer 814 through another conductive layer without direct contact between the conductive layers 818 and 814.

The transistor 802 can be used as the transistor with small off-state current.

In addition, an inverter and the like can be formed using the transistor 801.

The above is the description of the structure example of the memory circuit illustrated in FIGS. 6A and 6B.

As has been described with reference to FIGS. 4A to 4C, FIG. 5, and FIGS. 6A and 6B, in the memory circuit of this embodiment, a transistor that controls rewriting and reading of data includes an oxide semiconductor layer, and a transistor of a logic circuit such as an inverter includes a single crystal silicon layer. The above-described configuration enables high-speed operation of the memory circuit and long data holding period at the same time.

Table 1 shows comparison between a magnetic tunnel junction element (MTJ element) used in an MRAM and the memory circuit including a stacked-layer structure (also referred to as OS/Si) of an oxide semiconductor layer and silicon of this embodiment.

The MTJ element is disadvantageous in that magnetic properties are lost when the temperature is the Curie temperature or higher because a magnetic material is used. In addition, the MTJ element is compatible with a silicon bipolar device because current driving is employed; however, the bipolar device is unsuitable for high integration. Furthermore, the MTJ element has a problem in that its power consumption is increased with an increase in the amount of write current due to an increase in memory capacitance.

In addition, the MTJ element has low resistance to a magnetic field, so that the magnetization direction is likely to change when the MTJ element is exposed to a high magnetic field. Further, magnetic fluctuation is caused by nanoscaling of a magnetic body used for the MTJ element.

The material cost per bit of the MTJ element is expensive.

On the other hand, the transistor including an oxide semiconductor in this embodiment has an element structure and an operation principle which are similar to those of a silicon MOSFET except that the region in which the channel is formed includes a metal oxide. Further, the transistor formed using an oxide semiconductor is not influenced by a magnetic field, and does not cause soft errors. This shows that the transistor is highly compatible with a silicon integrated circuit.

Embodiment 3

In this embodiment, an example of a semiconductor device capable of controlling the power voltage supply independently for each circuit will be described.

First, a structure example of a semiconductor device is described with reference to FIG. 7.

Figure 7:
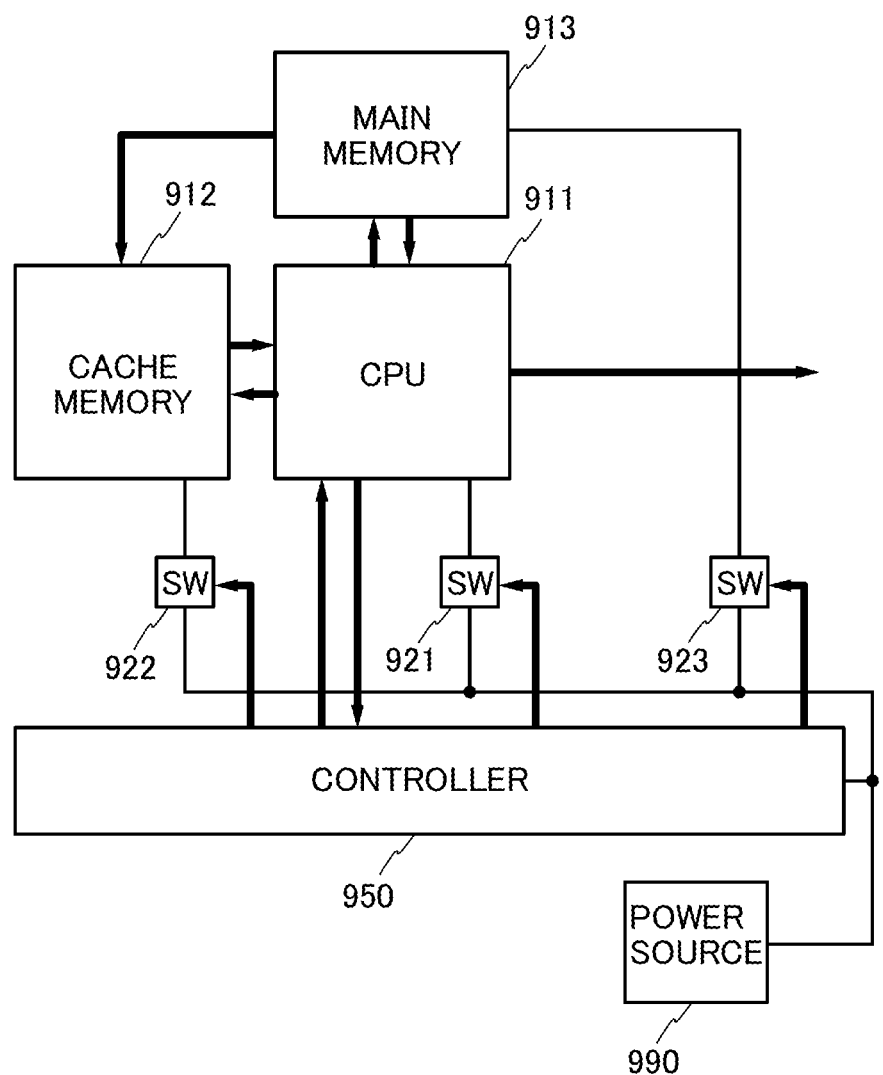
FIG. 7 illustrates an example of a semiconductor device.

The semiconductor device illustrated in FIG. 7 includes a CPU 911, a cache memory 912, a main memory 913, power supply control switches (each indicated by SW) 921 to 923

TABLE 1

|  | Spintronics (MTJ element) | Oxide semiconductor/Si |
| --- | --- | --- |
| 1. Heat resistance | Curie temperature | Process temperature around 500° C. (Reliability at 150° C.) |
| 2. Driving method | Current driving | Voltage driving |
| 3. Writing principle | Changing magnetization direction of magnetic body | On/off of FET |
| 4. Si LSI | Suitable for bipolar LSI (MOS device is preferable for high integration because bipolar device is unsuitable for high integration. Note that W gets larger.) | Suitable for MOS LSI |
| 5. Overhead | Large (due to high Joule heat) | Smaller by 2 to 3 or more orders of magnitude than the MTJ element (due to charging and discharging of parasitic capacitance) |
| 6. Nonvolatility | Utilizing spin | Utilizing low off-state current |
| 7. Number of reading times | Without limitation | Without limitation |
| 8. 3D conversion | Difficult (at most two layers) | Easy (the number of layers is limitless) |
| 9. Integration degree ($F^2$) | $4\,F^2$ to $15\,F^2$ | Depends on the number of layers stacked in 3D conversion (it is necessary to ensure heat resistance in process of forming upper OS FET) |
| 10. Material | Magnetic rare-earth element | Oxide semiconductor material |
| 11. Bit cost | High | Low (possibly slightly high depending on oxide semiconductor material (such as In)) |
| 12. Resistance to magnetic field | Low | High | which serve as power gates, and a controller 950. The CPU 911, the cache memory 912, the main memory 913, and the controller 950 can input and output signals to/from each other via buses. The power voltage PWR is supplied to the CPU 911, the cache memory 912, and the main memory 913 from a power source 990 via any of the power supply control switches 921 to 923. Note that the main memory 913 is not necessarily provided inside the semiconductor device.

The CPU 911 has a function of performing arithmetic operation in accordance with an input signal. Examples of the input signal are a clock signal, a signal for controlling the operation of the CPU 911, the cache memory 912, and the main memory 913, and a signal input from an input device. The CPU 911 outputs a signal having a value corresponding to the result of arithmetic operation. Note that in this specification, plural kinds of signals are simply referred to as a "signal" in some cases unless otherwise specified.

Further, the CPU 911 has a function of inputting an address signal to the cache memory 912 in arithmetic operation and reading data stored in the cache memory 912. In addition, the CPU 911 has a function of inputting an address signal to the main memory 913, reading data stored in the main memory 913, and writing the data to the cache memory 912.

A register in the CPU 911 is composed of a memory circuit including a volatile memory circuit and a nonvolatile memory circuit, for example. In this case, data is saved in the nonvolatile memory circuit immediately before the power voltage supply to the CPU 911 is cut off. Then, the data stored in the nonvolatile memory circuit is input to the volatile memory circuit immediately after the power voltage supply is provided. Thus, the speed of restoring the CPU 911 at the time when power voltage supply is provided can be increased. Note that one embodiment is not limited to the above structure, and the register may be composed of another memory circuit.

The nonvolatile memory circuit is formed using a transistor with low off-state current which can be employed to the memory circuit in Embodiment 1, for example. In this case, the transistor with low off-state current has a function of controlling data writing and data holding into/in the nonvolatile memory circuit.

In the cache memory 912, data is read in arithmetic operation of the CPU 911. For example, part of data in the main memory 913 is held in the cache memory 912 in response to a command signal of the CPU 911.

Figure 8:
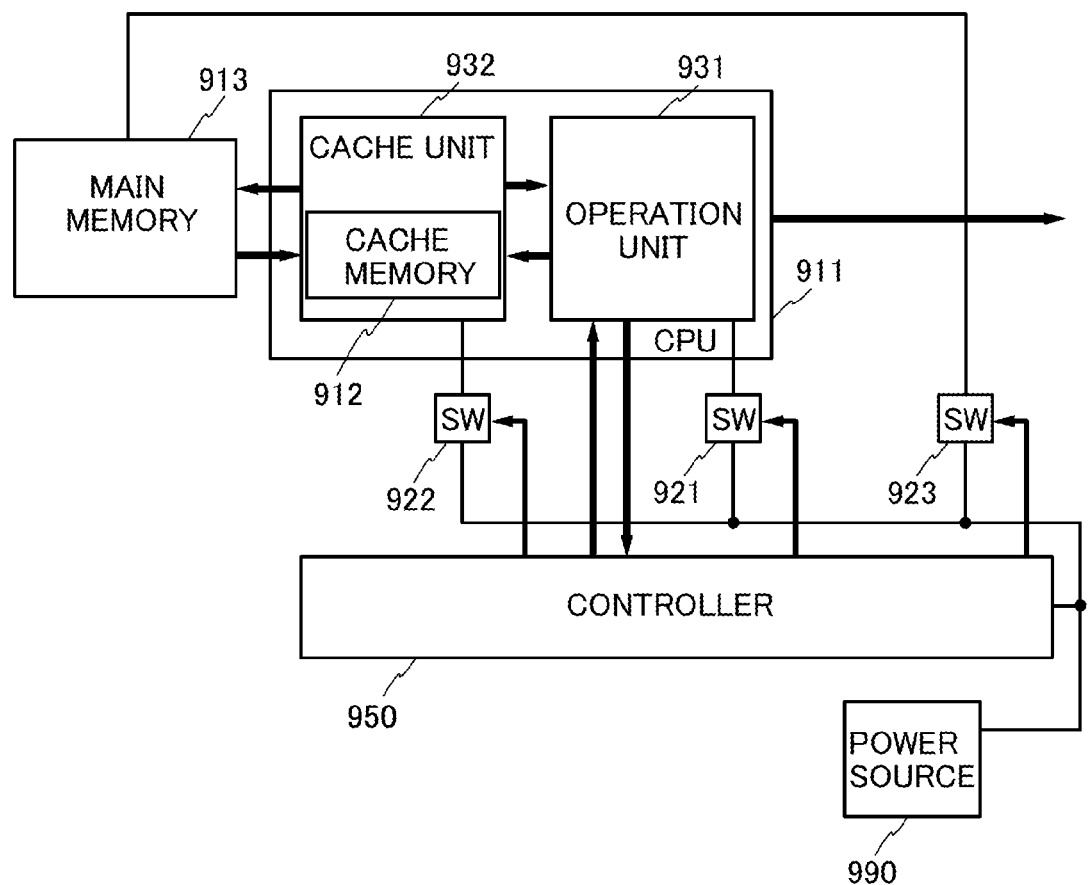
FIG. 8 illustrates an example of a semiconductor device.

Note that the cache memory 912 may be provided inside the CPU 911. For example, the CPU 911 includes an arithmetic operation unit 931 and a cache unit 932 including the cache memory 912 as illustrated in FIG. 8. In this case, data communication is performed between the arithmetic operation unit 931 and the main memory 913 via the cache memory 912. In addition, a plurality of cache memories may be provided in the cache unit 932 so that a data cache, an instruction cache, and the like are composed.

As the cache memory 912, for example, a direct mapped cache memory, a set-associative cache memory, a full-associative cache memory, or the like can be used.

The cache memory 912 is composed of a memory cell including the memory circuit in Embodiment 1. Accordingly, written data can be held for a long time even while power voltage supply is cut off. This makes it possible to cut the power voltage supply to the cache memory 912 in a period during which data rewriting and reading is unnecessary, thereby reducing power consumption.

In the maim memory 913, data used for arithmetic operation in the CPU 911 is stored, for example. The main memory 913 is formed using, for example, a dynamic random access memory (also referred to as DRAM) and the like.

The power supply control switch 921 has a function of controlling the power voltage supply to the CPU 911. In the case of the semiconductor device shown in FIG. 8, the power supply control switch 921 has a function of controlling power voltage supply to the arithmetic operation unit 931 of the CPU 911.

The power supply control switch 922 has a function of controlling power voltage supply to the cache memory 912.

The power supply control switch 923 has a function of controlling power voltage supply to the main memory 913.

Each of the power supply control switches 921 to 923 is formed using a field-effect transistor; the field-effect transistor may be the above-described transistor with low off-state current.

A configuration example of the power supply control switches 921 to 923 will be described with reference to FIG. 9.

Figure 9:
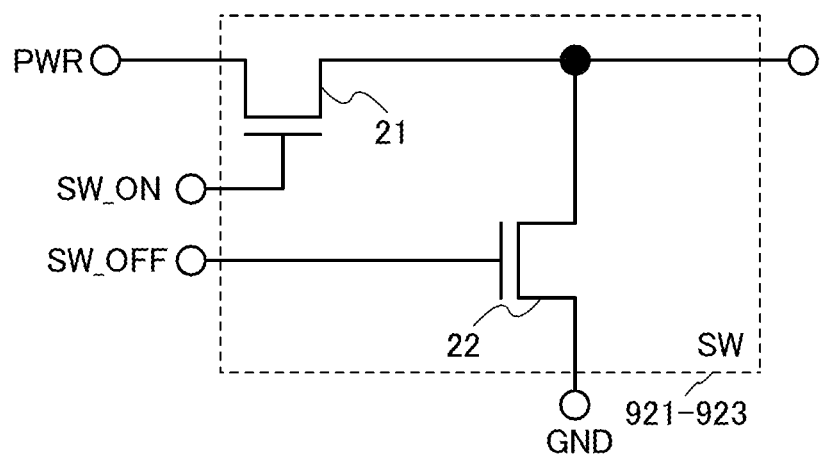
FIG. 9 illustrates an example of a configuration of a power supply control switch.

The power supply control switch illustrated in FIG. 9 includes a transistor 21 and a transistor 22.

The transistor 21 is provided between the power source 990 and each circuit such as the CPU 911, the cache memory 912, or the main memory 913. A gate of the transistor 21 is supplied with a control signal SW_ON from the controller 950. The transistor 21 controls whether or not a power voltage is supplied to the circuit such as the CPU 911, the cache memory 912, or the main memory 913 by being turned on or off.

A gate of the transistor 22 is supplied with a control signal SW_OFF from the controller 950. The transistor 22 controls whether or not a ground potential is supplied to the circuit such as the CPU 911, the cache memory 912, or the main memory 913 by being turned on or off.

The power supply control switch in FIG. 9 is "ON" when the transistor 21 is "ON" and the transistor 22 is "OFF". The power supply control switch in FIG. 9 is "OFF" when the transistor 21 is "OFF" and the transistor 22 is "ON".

The above is the description of the configuration example of the power supply control switch illustrated in FIG. 9.

The controller 950 illustrated in FIG. 7 and FIG. 8 at least has a function of individually controlling the power supply control switches 921 to 923 in response to the input signal and the instruction signal input from the CPU 911. The controller 950 is supplied with the power voltage PWR. Note that some of the power supply control switches 921 to 923 may be controlled by respective controller.

Further, a configuration example of the controller 950 will be described with reference to FIG. 10.

Figure 10:
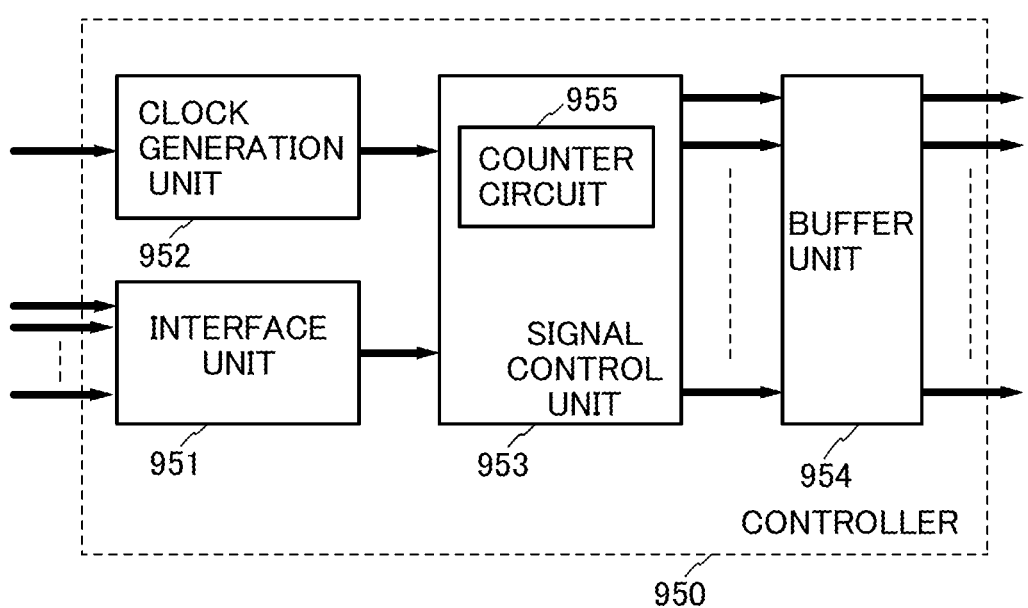
FIG. 10 illustrates an example of a configuration of a controller.

The controller 950 illustrated in FIG. 10 includes an interface unit 951, a clock generation unit 952, an output signal control unit 953, and a buffer unit 954.

Signals such as the above input signal and the instruction signal input from the CPU 911 are input to the output signal control unit 953 via the interface unit 951.

The clock generation unit 952 generates a clock signal used in the controller 950 by using an inputted clock signal, and outputs the generated clock signal to the circuits (the output signal control unit 953 included). Here, dividing the frequency of the inputted clock signal to be used in the controller 950 can reduce power consumption of the controller 950.

The output signal control unit 953 includes a counter circuit 955. The output signal control unit 953 has a function of counting clock signals by the counter circuit 955 and setting the state (high/low) of a plurality of output signals in response to a signal input to the controller 950. Examples of the plurality of output signals are control signals for individually controlling the power supply control switches 921 to 923 (e.g., control signals SW_ON and control signals SW_OFF) and a signal for controlling the operation of the CPU 911.

The signals generated in the output signal control unit 953 are output to the circuits via the buffer unit 954.

The above is the description of the configuration example of the controller illustrated in FIG. 10.

In the semiconductor device illustrated in FIG. 7, the power supply control switches 921 to 923 are provided and individually controlled by the controller 950 in response to an input signal and an instruction signal input from the CPU 911.

The optimal timing of power voltage supply varies between the CPU 911, the cache memory 912, and the main memory 913. For this reason, individual optimization of timing of power voltage supply to the CPU 911, the cache memory 912, and the main memory 913 can reduce unnecessary power consumption.

As described with reference to FIG. 7 to FIG. 10, an example of the semiconductor device according to this embodiment includes a cache memory and a CPU each of which is provided with a power supply control switch, and the power supply control switches are individually controlled by a controller in accordance with an input signal and an instruction signal inputted from the CPU. Accordingly, unnecessary power consumption can be reduced by individual optimization of timing of power voltage supply to the circuits.

Further, by using the memory circuit in Embodiment 1 for a cache memory, data can be held even while power voltage supply is cut off. Consequently, data write operation is not needed and power consumption can be reduced.

Embodiment 4

In this embodiment, examples of an electronic device provided with the semiconductor device which is one embodiment of the present invention will be described with reference to FIGS. 11A to 11F.

Figure 11A:
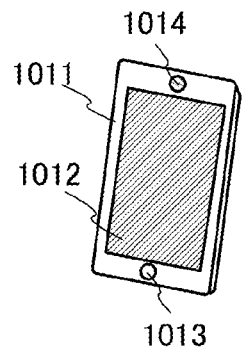
FIGS. 11A to 11F each illustrate an electronic device.

An electronic device in FIG. 11A is an example of a portable information terminal.

The electronic device illustrated in FIG. 11A has a housing 1011 and a panel 1012, a button 1013, and a speaker 1014 which are provided for the housing 1011.

The housing 1011 may be provided with a connection terminal for connecting the electronic device to an external device and a button for operating the electronic device.

The panel 1012 is a display panel (display) and preferably has a function of a touch panel.

The button 1013 is provided for the housing 1011. When the button 1013 is a power button, for example, pressing the button 1013 can turn on or off the electronic device.

The speaker 1014 is provided for the housing 1011. The speaker 1014 has a function of outputting sound.

Note that the housing 1011 may be provided with a microphone, in which case the electronic device illustrated in FIG. 11A can function as a telephone.

The electronic device in FIG. 11A includes the semiconductor device described in Embodiment 3 and the like inside the housing 1011.

The electronic device illustrated in FIG. 11A functions as one or more of a telephone set, an e-book reader, a personal computer, and a game machine, for example.

Figure 11B:
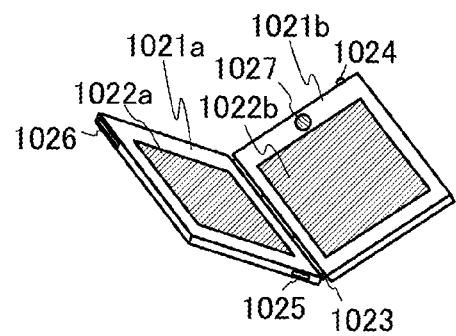

An electronic device illustrated in FIG. 11B is an example of a folding digital assistant.

The electronic device illustrated in FIG. 11B has a housing 1021a, a housing 1021b, a panel 1022a provided for the housing 1021a, a panel 1022b provided for the housing 1021b, a hinge 1023, a button 1024, a connection terminal 1025, a storage medium inserting portion 1026, and a speaker 1027.

The housing 1021a and the housing 1021b are connected by the hinge 1023.

Each of the panels 1022a and 1022b is a display panel (display) and preferably has a function of a touch panel.

Since the electronic device in FIG. 11B includes the hinge 1023, it can be folded so that the panels 1022a and 1022b face each other.

The button 1024 is provided for the housing 1021b. Note that the housing 1021a may also be provided with the button 1024. For example, when the button 1024 which functions as a power button is provided and pushed, supply of a power voltage to the electronic device can be controlled.

The connection terminal 1025 is provided for the housing 1021a. Note that the housing 1021b may be provided with the connection terminal 1025. Further alternatively, a plurality of connection terminals 1025 may be provided on one or both of the housings 1021a and the housing 1021b. The connection terminal 1025 is a terminal for connecting the electronic device illustrated in FIG. 11B to another device.

The storage media inserting portion 1026 is provided for the housing 1021a. Note that the storage medium insertion portion 1026 may be provided on the housing 1021b. Alternatively, the plurality of recording medium insertion portions 1026 may be provided for one or both of the housings 1021a and 1021b. For example, a card-type recording medium is inserted into the recording medium insertion portion so that data can be read to the electronic device from the card-type recording medium or data stored in the electronic device can be written to the card-type recording medium.

The speaker 1027 is provided for the housing 1021b and has a function of outputting sound. Note that the speaker 1027 may be provided for the housing 1021a.

The housing 1021a or the housing 1021b may be provided with a microphone, in which case the electronic device in FIG. 11B can function as a telephone, for example.

The electronic device in FIG. 11B includes the semiconductor device described in Embodiment 3 and the like inside the housing 1021a or the housing 1021b.

The electronic device illustrated in FIG. 11B has functions as one or more of a telephone set, an e-book reader, a personal computer, and a game machine, for example.

Figure 11C:
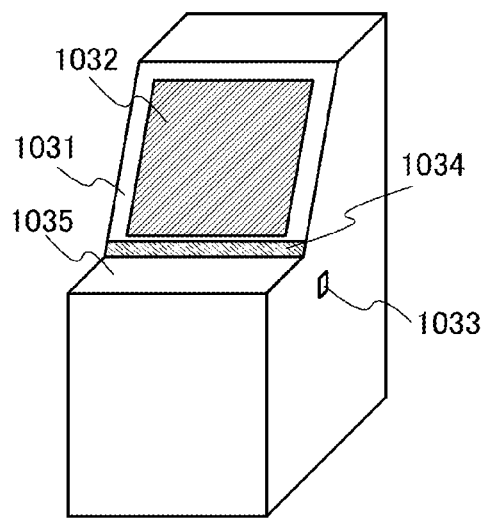

An electronic device in FIG. 11C is an example of a stationary information terminal. The stationary information terminal illustrated in FIG. 11C has a housing 1031, and a panel 1032, a button 1033, and a speaker 1034 that are provided for the housing 1031.

The panel 1032 is a display panel (display) and preferably has a function of a touch panel.

Note that a panel similar to the panel 1032 may be provided on a top board 1035 of the housing 1031, in which case the panel preferably has a function of a touch panel.

The housing 1031 may be provided with one or more of a ticket slot from which a ticket or the like is dispensed, a coin slot, and a bill slot.

The button 1033 is provided for the housing 1031. For example, when the button 1033 is a power button, supply of a power voltage to the electronic device can be controlled by pressing the button 1033.

The speaker 1034 is provided for the housing 1031. The speaker 1034 has a function of outputting sound.

The electronic device in FIG. 11C includes the semiconductor device described in Embodiment 3 and the like inside the housing 1031.

The electronic device illustrated in FIG. 11C has, for example, a function as an automated teller machine, an information communication terminal for ordering a ticket or the like (also referred to as a multi-media station), or a game machine.

Figure 11D:
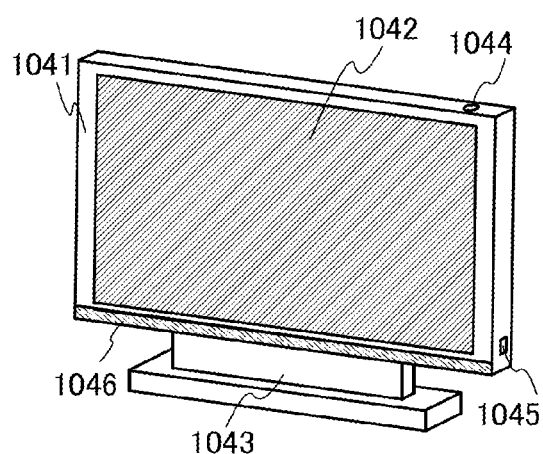

FIG. 11D illustrates another example of a stationary information terminal. The electronic device illustrated in FIG. 11D has a housing 1041, and a panel 1042, a button 1044, a connection terminal 1045, and a speaker 1046 that are provided for the housing 1041, and a support base 1043 supporting the housing 1041.

Note that a connection terminal for connecting the housing 1041 to an external device may be provided.

The panel 1042 has a function as a display panel (display).

The button 1044 is provided for the housing 1041. For example, when the button 1044 is a power button, supply of a power voltage to the electronic device can be controlled by pressing the button 1044.

The connection terminal 1045 is provided for the housing 1041. The connection terminal 1045 is a terminal for connecting the electronic device illustrated in FIG. 11D to another device. For example, when the electronic device in FIG. 11D and a personal computer are connected with the connection terminal 1045, the panel 1042 can display an image corresponding to a data signal input from the personal computer. For example, when the panel 1042 of the electronic device illustrated in FIG. 11D is larger than a panel of an electronic device connected thereto, a displayed image of the electronic device can be enlarged, in which case a plurality of viewers can recognize the image at the same time with ease.

The speaker 1046 is provided for the housing 1041. The speaker 1046 has a function of outputting sound.

The electronic device in FIG. 11D includes the semiconductor device described in Embodiment 3 and the like inside the housing 1041.

The electronic device illustrated in FIG. 11D functions as, for example, an output monitor, a personal computer, and/or a television set.

Figure 11E:
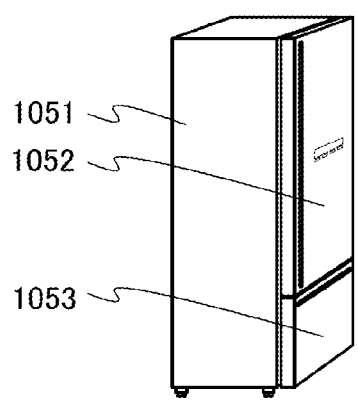

FIG. 11E illustrates an example of an electric refrigerator-freezer. The electronic device illustrated in FIG. 11E includes a housing 1051, a refrigerator door 1052, and a freezer door 1053.

The electronic device in FIG. 11E includes the semiconductor device described in Embodiment 3 and the like inside the housing 1051. With this structure, supply of a power voltage to the semiconductor device in the housing 1051 can be controlled in response to opening and closing of the refrigerator door 1052 and the freezer door 1053, for example.

Figure 11F:
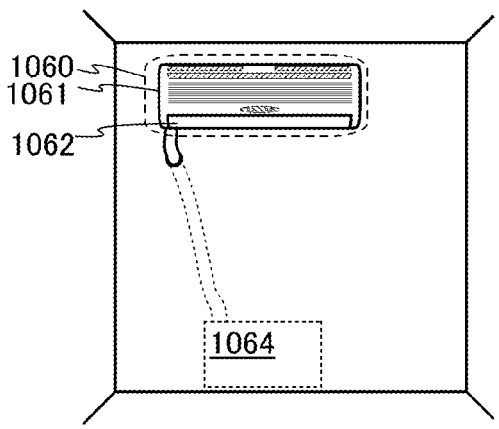

FIG. 11F illustrates an example of an air conditioner. The electronic device illustrated in FIG. 11F includes an indoor unit 1060 and an outdoor unit 1064.

The indoor unit 1060 includes a housing 1061 and a ventilation duct 1062.

The electronic device in FIG. 11F includes the semiconductor device described in Embodiment 3 and the like inside the housing 1061. With this structure, supply of a power voltage to the semiconductor device in the housing 1061 can be controlled in response to a signal from a remote controller, for example.

Note that although the separated air conditioner including the indoor unit and the outdoor unit is shown in FIG. 11F as an example, it may be an air conditioner in which the functions of an indoor unit and an outdoor unit are integrated in one housing.

Examples of the electronic devices are not limited to the above, and the semiconductor device in Embodiment 3 can also be applied to a high-frequency heating apparatus such as a microwave oven, an electric rice cooker, and the like.

The above is the description of the electronic devices illustrated in FIGS. 11A to 11F.

As described with reference to FIGS. 11A to 11F, the electronic device in this embodiment consumes less power by using the semiconductor device in Embodiment 3.

This application is based on Japanese Patent Application serial No. 2012-032437 filed with Japan Patent Office on Feb. 17, 2012, the entire contents of which are hereby incorporated by reference.

What is claimed is:
1. A memory circuit comprising:
a first transistor;
a second transistor;
a first inverter comprising an input terminal connected to one of a source electrode and a drain electrode of the first transistor, and an output terminal;
a second inverter comprising an input terminal connected to one of a source electrode and a drain electrode of the second transistor, and an output terminal;
a third transistor comprising one of a source electrode and a drain electrode connected to the input terminal of the first inverter and the one of the source electrode and the drain electrode of the first transistor, and the other of the source electrode and the drain electrode connected to the output terminal of the second inverter;
a fourth transistor comprising one of a source electrode and a drain electrode connected to the input terminal of the second inverter and the one of the source electrode and the drain electrode of the second transistor, and the other of the source electrode and the drain electrode connected to the output terminal of the first inverter;
a fifth transistor comprising one of a source electrode and a drain electrode connected to the one of the source electrode and the drain electrode of the first transistor and the one of the source electrode and the drain electrode of the third transistor;
a first capacitor comprising a first electrode connected to the other of the source electrode and the drain electrode of the fifth transistor;
a sixth transistor comprising one of a source electrode and a drain electrode connected to the one of the source electrode and the drain electrode of the second transistor and the one of the source electrode and the drain electrode of the fourth transistor; and
a second capacitor comprising a first electrode connected to the other of the source electrode and the drain electrode of the sixth transistor,
wherein each of the fifth transistor and the sixth transistor has an off-state current per channel width of 1 μm is 100 zA or lower.

2. The memory circuit according to claim 1,
wherein the fifth transistor is turned on or off in accordance with a first control signal, and
wherein the sixth transistor is turned on or off in accordance with a second control signal.

3. The memory circuit according to claim 1,
wherein each of the first transistor, the second transistor, the fifth transistor and the sixth transistor includes an oxide semiconductor layer whose bandgap is larger than bandgap of silicon.

4. The memory circuit according to claim 1,
wherein each of the first transistor, the second transistor, the fifth transistor, and the sixth transistor includes an oxide semiconductor layer,
wherein the oxide semiconductor layer includes crystal parts, wherein a c-axis in each of the crystal parts is aligned in a direction parallel to a normal vector of a surface where the oxide semiconductor layer is formed or a normal vector of a surface of the oxide semiconductor layer, wherein metal atoms in each of the crystal parts are arranged in a triangular or hexagonal configuration when seen from the direction perpendicular to an a-b plane, and wherein metal atoms and oxygen atoms in each of the crystal parts are arranged in a layered manner when seen from the direction perpendicular to the c-axis.

5. A semiconductor device comprising:

a cache memory including the memory circuit according to claim 1;

a CPU having a function of reading data stored in the cache memory and performing arithmetic operation of the data;

a first power supply control switch for controlling supply of a power voltage to the CPU;

a second power supply control switch for controlling supply of a power voltage to the cache memory; and a controller having at least a function of controlling the first and the second power supply control switches independently in accordance with the input signal and an instruction signal inputted from the CPU.

* * * * *